United States Patent [19]

Shibata et al.

[11] Patent Number: 5,042,945
[45] Date of Patent: Aug. 27, 1991

[54] LITHOGRAPHIC MASK STRUCTURE AND DEVICE FOR POSITIONING THE SAME

[75] Inventors: Hirofumi Shibata, Asahikawa; Yasuaki Fukuda, Hadano, both of Japan

[73] Assignee: Canon Kabushiki Kaisha, Tokyo, Japan

[21] Appl. No.: 343,386

[22] Filed: Apr. 26, 1989

[30] Foreign Application Priority Data

Apr. 28, 1988 [JP] Japan .................................. 63-107061

[51] Int. Cl.⁵ .............................................. G01B 11/26
[52] U.S. Cl. ...................................... 356/150; 356/152; 356/154
[58] Field of Search ............. 356/150, 152, 154, 138, 356/401

[56] References Cited

U.S. PATENT DOCUMENTS

| | | | |
|---|---|---|---|
| 3,449,961 | 1/1969 | Samsel | 356/152 |
| 3,583,815 | 6/1971 | Kersey | 356/152 |
| 3,657,792 | 4/1972 | Hug et al. | 356/154 |
| 3,695,767 | 10/1972 | George et al. | 356/154 |
| 3,954,339 | 5/1976 | Atwood et al. | 356/152 |
| 4,298,281 | 11/1981 | Schave | 356/138 |
| 4,573,791 | 3/1986 | Phillips | 356/401 |
| 4,801,120 | 1/1989 | Katoh et al. | 356/401 |

FOREIGN PATENT DOCUMENTS 3025488  2/1981  Fed. Rep. of Germany .

OTHER PUBLICATIONS

Patent Abstracts of Japan, vol. 7, No. 260, p. 166 P237.

*Primary Examiner*—Richard A. Rosenberger
*Attorney, Agent, or Firm*—Fitzpatrick, Cella, Harper & Scinto

[57] ABSTRACT

A mask structure and a mask positioning device, executes accurate and quick positioning of a mask having a generally ring-like shape. The mask structure includes a supporting frame of a generally ring-like shape, and at least one flat surface formed by a mirror surface is provided at a peripheral part of the supporting frame. Light is projected upon the flat surface and, on the basis of detection of reflected light therefrom, the mask can be positioned with respect to the rotational direction, the inclination and orthogonal coordinate position. The mask positioning device is adapted to execute such positioning accurately and quickly.

2 Claims, 6 Drawing Sheets ns5,042,945

LITHOGRAPHIC MASK STRUCTURE AND DEVICE FOR POSITIONING THE SAME

FIELD OF THE INVENTION AND RELATED ART

This invention relates to a mask structure usable in a lithographic apparatus for use in the manufacture of semiconductor microcircuit devices such as integrated circuits (ICs), large scaled integrated circuits (LSIs) and the like, and also to a device for positioning such a mask with respect to a lithographic apparatus.

In the field of lithographic exposure apparatuses for use in the manufacture of semiconductor microcircuit devices, many proposals have been made for an exposure apparatus of the type that uses X-rays of a wavelength of 1-150 angstroms, having the ability to perform high resolution printing, in order to meet the demand for further increases in the density of semiconductor microcircuits.

Usually, a lithographic mask usable in such an exposure apparatus of the type that uses X-rays is formed by a ring-like supporting frame and a film-like member that comprises a film substrate, called a "membrane" (a member transparent to X-rays), being stretched and adhered to the supporting frame to cover an opening thereof and a pattern (non-transparent area) formed on the film substrate.

FIGS. 1 and 2 are a top plan view and a sectional view, respectively, showing an example of a known type lithographic mask 81 adapted to be used with X-rays.

In this example, an adhesive agent is applied to a peripheral portion of a ring-like supporting frame 83 and a film substrate 82, being stretched by tension, is adhered to the supporting frame and secured thereto by adhesion. The film substrate 82 is cut along the outer peripheral edge of the supporting frame 83 so that no portion of the film substrate hangs out of the supporting frame 83. Reference numeral 84 denotes a pattern formed of an X-ray absorptive material.

As regards the thickness of the film substrate 82, usually it is 5-10 microns where the substrate is provided by an organic material film (polyimide, for example), whereas it is 2-5 microns where the film is provided by an inorganic material film (SiO or SiC, for example).

With regard to the supporting frame 83, while it is different depending on the process of manufacture of the same, in many cases a silicon plate or otherwise of a thickness of 2-3 mm is used where the film substrate is made of an inorganic material (e.g. silicon nitride) or a thicker glass plate or otherwise (e.g. Pyrex glass of a thickness of 5 mm) is used where the film substrate is made of an organic material (e.g. polyimide). In any case, basically, the supporting frame has an annular or ring-like shape, having rotational symmetry, in order to assure that tension is uniformly applied to the film substrate, bearing an absorptive material, to minimize any local distortion of the same.

In a process of pattern transfer using a semiconductor device manufacturing exposure mask, usually mask-to-wafer alignment is executed prior to the exposure.

In order to ensure high-precision photo-lithography using a proximity exposure process, including the X-ray lithographic process, the clearance (printing gap) between a workpiece (e.g., a silicon wafer having a surface coating with a photoresist material) and a masking material supporting film of a mask structure should be maintained exactly at a predetermined distance and, at the same time, the mask surface and the wafer surface should be maintained in parallel to each other, and, additionally, the mask and the wafer should be aligned into a predetermined positional relationship quickly and accurately with a precision of the order of 1/100 micron, for example.

However, because of the circular configuration of the X-ray mask structure, it is very difficult to detect and adjust the rotational position of the mask structure quickly and precisely, which difficulty leads to decreased precision of pattern transfer or decreased throughput of the manufacture of microcircuit devices.

SUMMARY OF THE INVENTION

It is accordingly an object of the present invention to provide a lithographic mask structure of the type in which a mask membrane bearing a pattern is adhered to a supporting frame having a generally circular configuration, wherein the mask structure is specifically arranged to be best suited to the positioning of the same in a rotational direction relative to a workpiece such as a wafer and/or to be best suited to correction of any inclination of the mask structure, whereby the positioning and/or the correction can be made quickly and precisely.

It is another object of the present invention to provide a positioning device suitably usable with such a mask structure, for positioning the same.

In accordance with an aspect of the present invention, there is provided a mask structure which includes a mask membrane for supporting a pattern to be transferred onto a workpiece and which is stretched and adhered, at its peripheral portion, to a peripheral portion of a supporting frame of generally ring-like shape, wherein the supporting frame is provided with at least one flat surface having a mirror surface extending substantially perpendicularly to a bottom face of the supporting frame.

In accordance with another aspect of the present invention, there is provided a positioning device suitably usable with such a mask structure for effectively positioning the same by using the mirror-surface flat of the mask structure.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
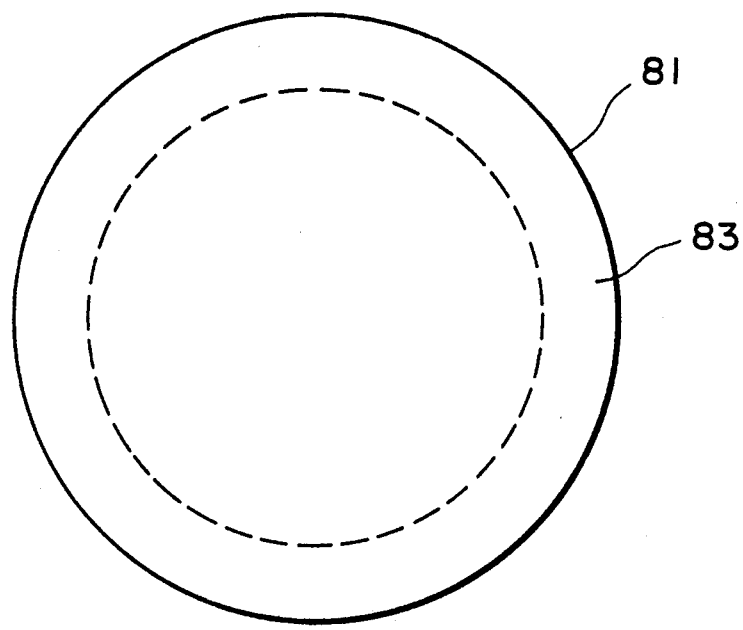
FIGS. 1 and 2 are a top plan view and a sectional view, respectively, showing an example of known type X-ray mask structure.
Figure 2:
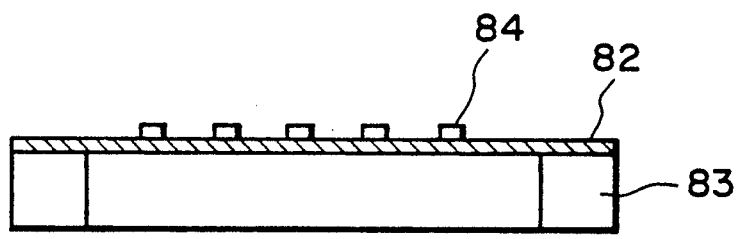
Figure 3:
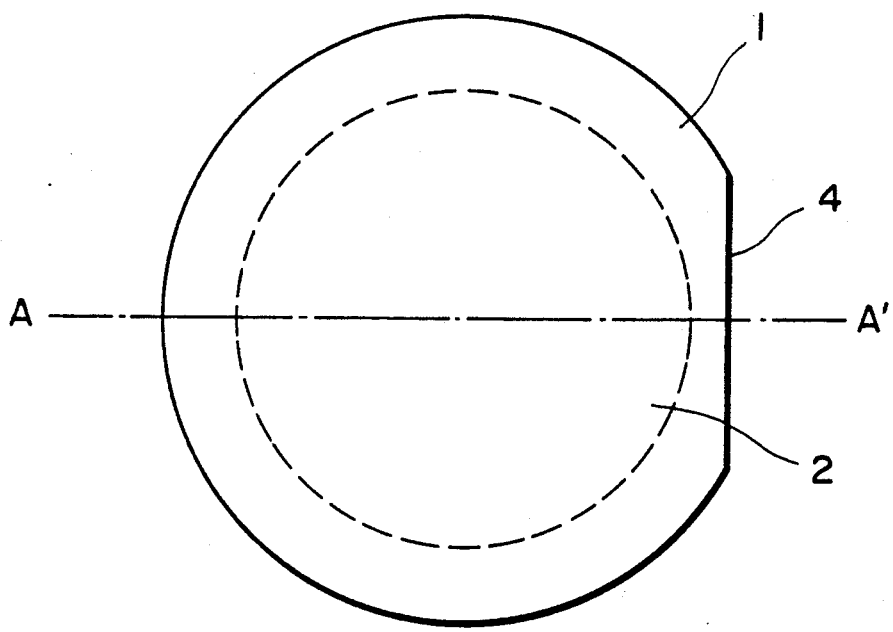
FIG. 3 is a top plan view of an X-ray mask structure according to an embodiment of the present invention.
Figure 4:
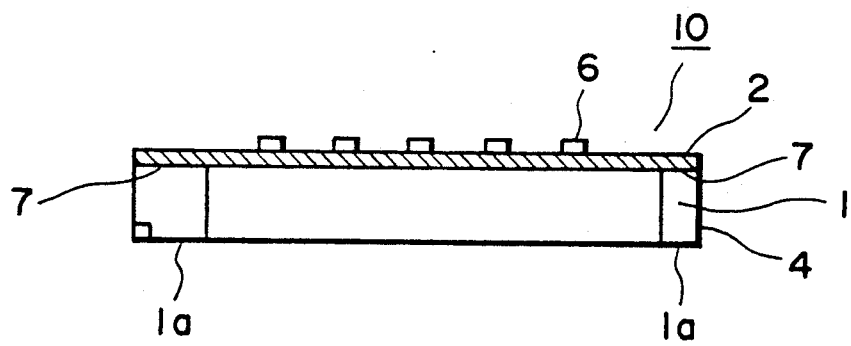
FIG. 4 is a sectional view taken on a line A—A' in FIG. 3.

FIG. 3 is a top plan view of a lithographic mask structure, more particularly, an X-ray lithographic mask structure, according to a first embodiment of the present invention. FIG. 4 is a sectional view taken on a line A—A' in FIG. 3. The mask structure is denoted generally at 10.

In FIGS. 3 and 4, reference numeral 1 denotes a supporting frame having a generally ring-like shape. The supporting frame may be made of metal having a good heat conductivity such as, for example, iron, nickel, cobalt, brass, tungsten or molybdenum. Alternatively, it may be made of an alloy comprising two or more of these metals. As a further alternative, it may be made of a material having a small heat expansion coefficient such as, for example, Pyrex glass or quartz.

The supporting frame 1 is provided at a region of the ring-like portion with a flat surface 7 having been ground to super flatness by a lapping process or otherwise. By this flat surface 7, the flatness of a membrane (pattern bearing film) to be stretched and adhered to the supporting frame (as will be described later) is determined. Denoted at 2 is the membrane which may be provided by an organic thin film made of a material such as, for example, polyimide, polyamide, polyester or Parylene or, alternatively, it may be made of an inorganic thin film of a material such as, for example, boron nitride, silicon nitride, aluminum nitride, silicon carbide or titanium. As a further alternative it ma be provided by a combination of organic and inorganic films or a film of a composite of appropriate ones of these materials.

Denoted at 6 is an X-ray absorptive material member which is formed in a predetermined pattern on the membrane 2 surface. The X-ray absorptive material member 6 may be provided by a thin film (of a thickness of 0.5-1 micron order) made of a material such as, for example, metal having a high X-ray absorption factor. Examples of such a material are: gold, platinum, tantalum, tungsten, palladium, rhodium, indium and nickel. Denoted at 4 is a cut-away surface which is formed at a part of the peripheral portion of the ring-like supporting frame 1 so that the surface extends substantially perpendicularly to the bottom face 1a of the supporting frame 1. The cut-away surface 4 has been finished substantially into a mirror surface by means of milling and grinding.

In this embodiment, a membrane 2 is press-contacted to the flat surface 7 of the supporting frame 1 with an adhesive agent intervening therebetween, so that the membrane 2 is secured to the supporting frame 1 as the adhesive agent sets. After this, any portion of the membrane 2 hanging out of the outer periphery of the supporting frame is cut along the outer periphery of the frame. X-ray absorptive material can be patterned exactly on the membrane 2 while using the cut-away surface 4 as a reference.

Examples of the material of an adhesive usable in this embodiment are elastomeric adhesive, epoxy adhesive, emulsion adhesive, amine adhesive and polyimide adhesive. Thermosetting type, photo-setting type, solvent type or otherwise is usable. Particularly, use of an adhesive having high shear strength and good heat resistivity is preferable.

When a lithographic mask according to this embodiment is used for the photolithographic process, the mask is introduced into an exposure apparatus and, while using the cut-away surface 4 of the mask 10 as a reference, it can be set at a predetermined site in the exposure apparatus with its rotational direction and its orthogonal coordinate position being aligned correctly.

For a second and subsequent exposures for superposed printing, like the first exposure the cut-away surface 4 is used as a reference. This significantly facilitates the alignment of the mask with respect to the exposure apparatus, in the rotational direction and the orthogonal coordinate position.

Figure 5:
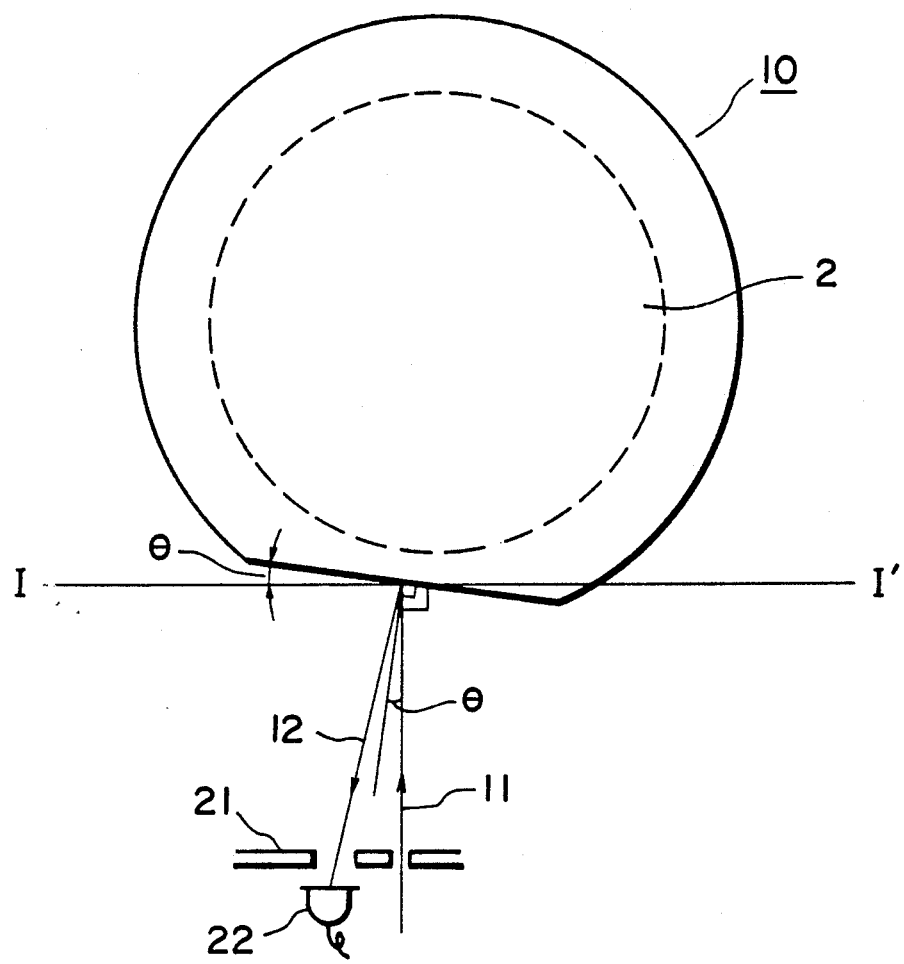
FIG. 5 is a schematic view, illustrating the manner of positioning a mask structure, arranged in accordance with the present invention, in a rotational direction.
Figure 6:
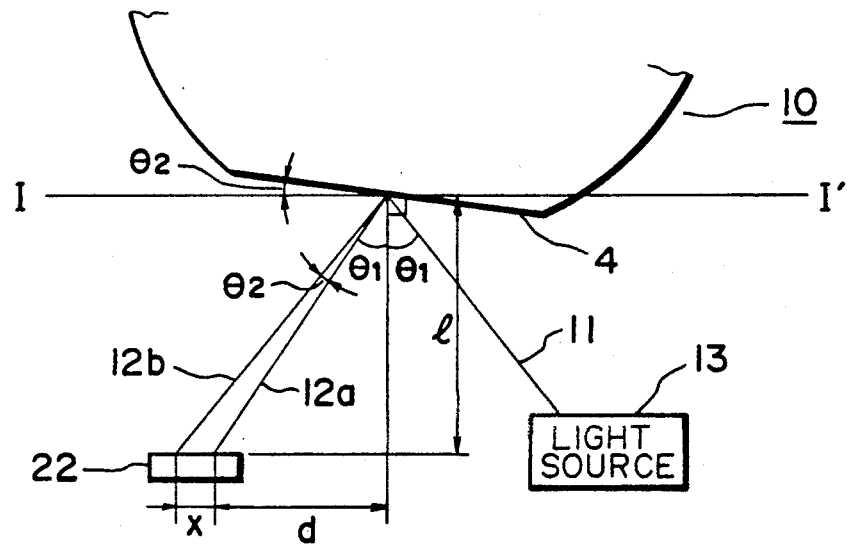
FIG. 6 is a schematic view, illustrating the principle of detecting a positional error of a mask structure in a rotational direction.
Figure 7:
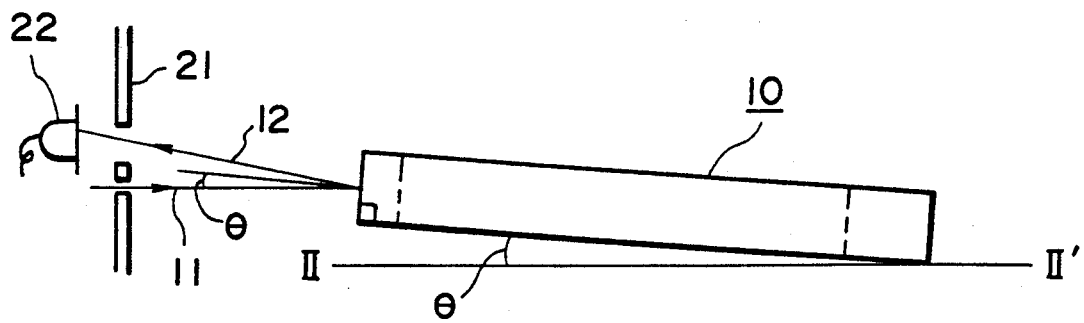
FIG. 7 is a schematic view, illustrating the principle of correction of the inclination of a mask structure, in accordance with the present invention.

FIGS. 5-7 illustrate a positioning device according to an embodiment of the present invention, which device is effective to execute the positioning of a mask, according to the present invention, with respect to a rotational direction and a vertical direction, while using a cutaway surface provided at a part of the mask.

In FIG. 5, a parallel light 11 (for example, an infrared light or a laser beam) is projected upon a cut-away surface 4 of a mask 10, for positioning of the same. Reflected light 12 from the cut-away surface 4 is detected by a detector 22, whereby any angular difference $2\theta$ related to the rotational position of the mask 10 is detected. By rotating the mask 10 by an angle $\theta$, the cut-away surface 4 can be aligned with a reference direction I—I'. The principle will be explained in greater detail, using FIG. 6.

In the FIG. 6 example, position detecting light 11 is projected from a light source 13 upon a cut-away surface 4 of a mask 10, with inclination, as seen in this figure. Photodetector 22 has a light receiving surface which is set in parallel to the reference direction I—I'. Denoted at 12a is a reflection light from the cut-away surface 4 when the same is aligned with the reference direction I—I'. Denoted at 12b is a reflection light from the cut-away surface 4 when the same is inclined by an angle $\theta 2$ with respect to the reference direction I—I'. Denoted at l is the interval between the position of incidence of the inputted light 11 upon the cut-away surface 4 and a plane which contains the light receiving surface of the detector 22. Denoted at d is the interval between a normal to the cut-away surface 4 (as it is aligned with the reference direction I—I'), passing the position of incidence of the light 11, and the position of incidence of the reflected light 12a upon the light receiving surface of the detector 22. Denoted at x is the interval between the positions of incidence of the reflected lights 12a and 12b upon the light receiving surface of the detector 22.

Assuming that $$\theta 1 + \theta 2 = \theta,$$

then $$\theta = \tan^{-1}[(d+x)/l]$$

Therefore, the inclination $\theta 2$ can be given by:

$$\theta 2 = \tan^{-1}[(d+x)/l] - \theta 1$$

In this example, the intervals d and l and the angle $\theta 1$ are all predetermined, i.e., are design values.

The manner of calculating the inclination of the cut-away surface 4 with respect to the reference direction I—I', as explained in the above, is only an example and the inclination can be detected in any other way. It will be readily understood that the manner of calculation is changeable with an adopted arrangement of the positioning device such as, for example, the disposition of the photodetector or otherwise. Usually, the calculation may be made in a control device which will be described later.

Referring to FIG. 7, a parallel light 11 is projected upon the cut-away surface 4 of the mask 10, in a direction parallel to a reference plane II—II' defined for the cut-away surface 4. Thus, by detecting any angle defined between a reflected light 12 and the reference plane II—II' of the mask 10, the angular position of the mask 10 surface with respect to the reference plane II—II' can be determined.

In the described manner, the mask 10 can be aligned into a desired rotational direction and a predetermined inclination. After this, one or more visible light beams may be projected upon one or more alignment marks provided on the mask structure and one or more alignment marks provided on a semiconductor wafer, to execute the mask-to-wafer alignment. By this, they can be set in a state ready for exposure.

A positioning device suitable for executing the above-described positioning process will be explained below.

Figure 8:
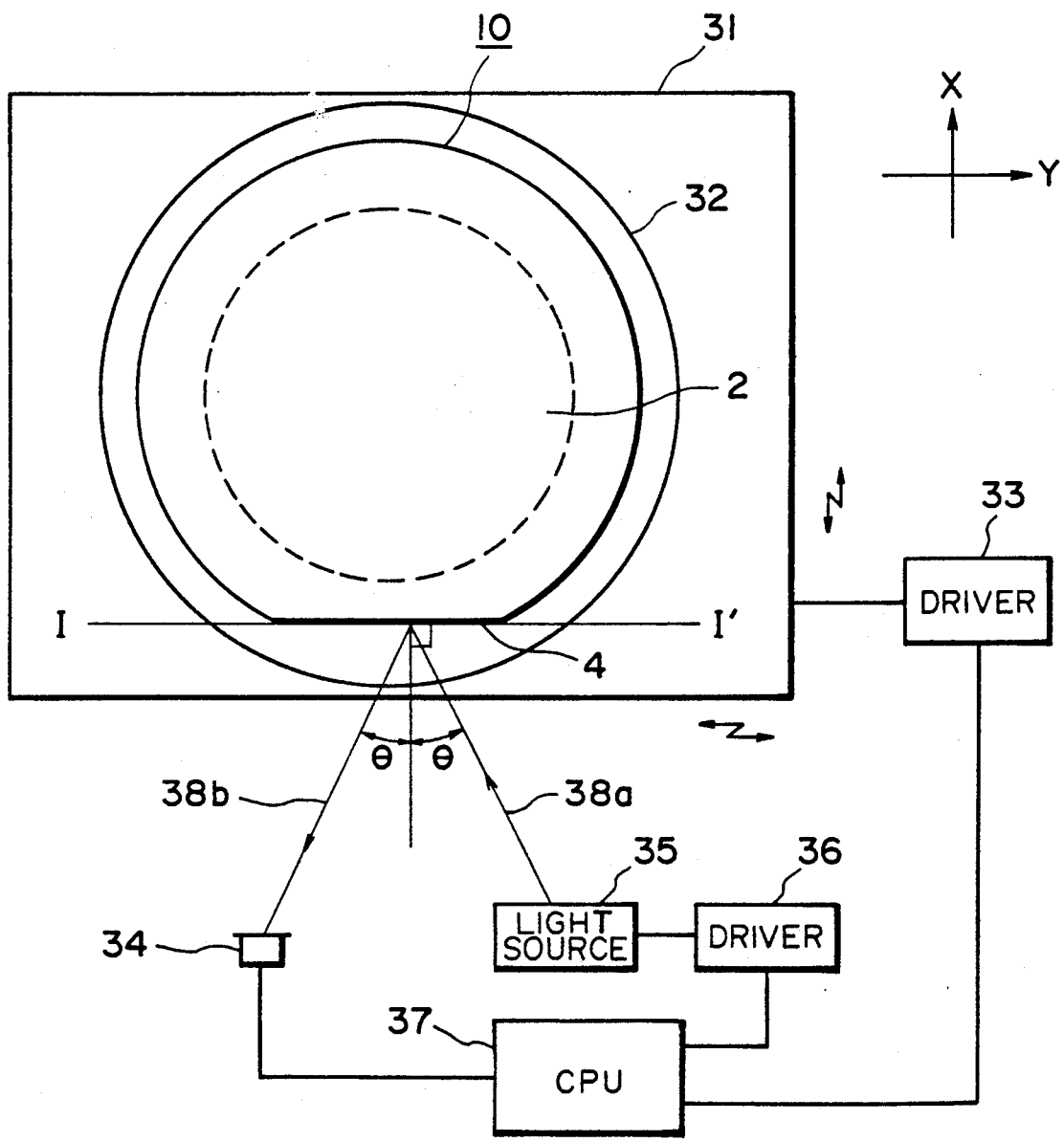
FIG. 8 is a schematic and diagrammatic view, showing a positioning device according to an aspect of the present invention, which device is suitably usable with a mask structure according to the present invention for effectively positioning the same.

FIG. 8 illustrates a positioning device according to an aspect of the present invention. In this figure, like numerals are assigned to similar or corresponding elements. In the state shown in FIG. 8, a mask structure 10 has been introduced into the positioning device.

Denoted at 31 is an X-Y stage which is movable in X-axis and Y-axis directions; denoted at 32 is a rotatable and tiltable $\theta$ stage which is rotatable in an X-Y plane and also is tiltable relatively to the X-Y plane; denoted at 33 is a drive source for moving each of the X-Y stage 31 and the $\theta$ stage 32; and denoted at 34 is a detector. While the type of the detector 34 may depend on the manner of detection to be made, in this embodiment a linear image sensor or an area sensor, having a flat light receiving surface, is used.

Denoted at 35 is a light source such as a laser, for example; denoted at 36 is a driving means for actuating the light source 35; denoted at 37 is a control means (central processing unit) for controlling the stage driving means, the light source driving means and the like, and being adapted to receive an output of the detector 34; denoted at 38a is a light which emanates from the light source 35 and impinges on a cut-away surface 4 of the mask 10; and denoted at 38b is a reflected light from the cut-away surface 4 and impinging upon the light receiving surface of the detector 34.

In operation, the light 38a from the light source is reflected by the cut-away surface 4 so that, as a reflection light 38b, it is received by the detector 34. Thus, the detector produces and applies to the control means 37 an output signal corresponding to the position of incidence of the reflected light 38b upon its light receiving surface, in response to which the control means 37 detects any inclination of the cut-away surface 4 with respect to the reference direction I—I' in accordance with calculation such as described in the foregoing, for example. Then, on the basis of a detected value, the control means 37 operates to move the $\theta$ stage 32 through the driving means 33, such that the cut-away surface 4 is brought into alignment with the reference direction I—I'.

While in relation to FIG. 8, a description has been provided only to the $\theta$ direction correction mechanism for adjusting the rotational position of the mask in the X-Y plane, this is merely for simplicity of explanation. The correction in the vertical direction can be made by using a similar mechanism. In that case, a separate mechanism including a sensor, a light source and the like may be provided for the correction in the vertical direction, in addition to the $\theta$-correction mechanism. However, the $\theta$-correction mechanism as described above may conveniently be used also for that purpose.

Figure 9:
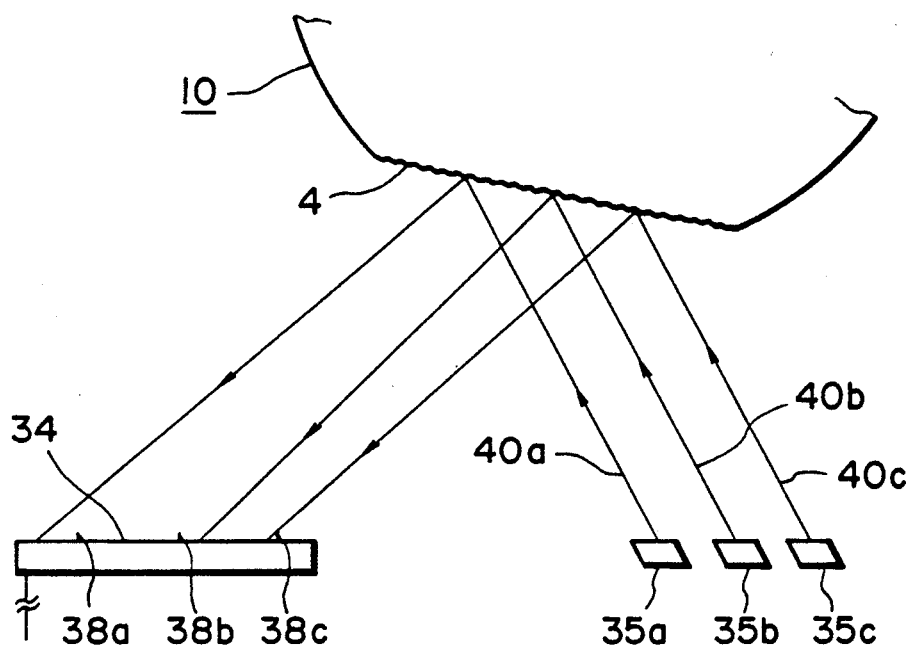
FIG. 9 is a schematic view, showing a major portion of a positioning device according to another aspect of the present invention.

Referring now to FIG. 9, another embodiment of the present invention will be explained.

While in the foregoing embodiments, a single light such as a laser beam, for example, is projected upon a cut-away surface 4 of a mask 10 and the rotational ($\theta$-direction) position of the mask 10 is detected by using a reflected light from the cut-away surface 4, if the cut-away surface 4 contains small surface roughness, there is a possibility that the detection of the rotational position of the mask is affected by the surface roughness. In consideration of this, i.e., in order to assure further improvements in the precision of the position detection, the present embodiment includes a specific arrangement which will be described below.

In FIG. 9, denoted at 35a, 35b and 35c are light sources each being similar to that as described; denoted at 40a, 40b and 40c are lights emanating from respective light sources 35a–35c and advancing toward a cut-away surface 4 of a mask 10; denoted at 34 is a detector of the type such as described; and denoted at 38a, 38b and 38c are those positions on the light receiving surface of the detector 34 at which the lights 40a–40c reflected by the cut-away surface 4 would be received by the detector 34, provided that the mask 10 has no $\theta$-error and that the cut-away surface 4 is formed by an idealistic flat surface.

When, in this embodiment, the deviations of the positions of incidence, upon the light receiving surface of the detector 34, of the lights 40a–40c reflected from the cut-away surface 4 with respect to the respective reference positions 38a, 38b and 38c are denoted by $x_a$, $x_b$ and $x_c$, respectively, these deviations $x_a$–$x_c$ will not be exactly equal to each other due to a possible small roughness of the cut-away surface 4. Where a single light is used, it is difficult to exclude, out of a detected $\theta$ error value of the mask 10, any variation component of the position of incidence of the light resulting from such small roughness of the cut-away surface 4. In the present embodiment, as compared therewith, it can be excluded by statistically processing the detected deviations $x_a$–$x_c$, by using the least square method, for example. To determine the $\theta$ error in that case: where a $\theta$ error related to the detected deviation $x_a$ is denoted by $\theta_a$, a $\theta$ error related to the detected deviation $x_b$ is denoted by $\theta_b$, a $\theta$ error related to the detection deviation $x_c$ is denoted by $\theta_c$, and the $\theta$ error which is the one to be detected is denoted by $\bar{\theta}$; then, as an example, a computation may be made by the CPU to detect such a "$\bar{\theta}$" by which an evaluated value V as can be expressed by the following equation can be reduced to a minimum:

$$V = (\theta_a - \bar{\theta})^2 + (\theta_b - \bar{\theta})^2 + (\theta_c - \bar{\theta})^2$$

Basically, the thus detected $\theta$ can be considered as one having been determined with the random variation components of the measured values $\theta_a$, $\theta_b$ and $\theta_c$ canceled with each other. Therefore, according to the present embodiment, it is possible to accurately detect the $\theta$ error even if the cut-away surface 4 contains small surface roughness. It will be readily understood from the foregoing that the described method is very effective to detect the rotational position of the mask 10 with higher precision. On the other hand, with the described method, the machining precision for the cut-away surface 4 can be lowered, which facilitates the machining process itself.

Figure 10:
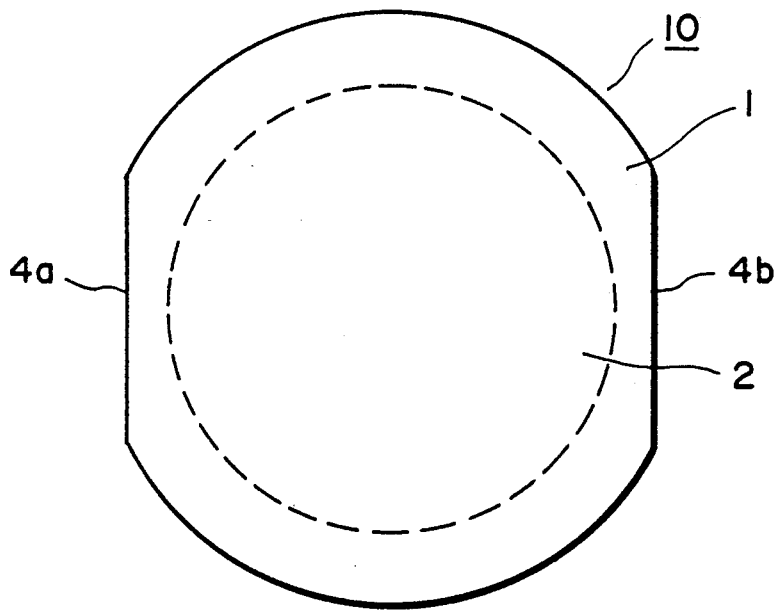
FIG. 10 is a top plan view of a mask structure according to another embodiment of the present invention.

Referring now to FIG. 10, there is shown a lithographic mask structure according to a further embodiment of the present invention. In this embodiment, two cut-away surfaces 4a and 4b are provided substantially symmetrically at peripheral portions of a supporting frame 1 having a generally ring-like shape.

Each of the two cut-away surfaces 4a and 4b has been formed by means of milling and grinding, using a surface grinder, so that it extends at an angle of 90±0.05 degrees with the bottom face of the supporting frame 1. Further, each cut-away surface has been finished by means of a lapping process into a polished mirror surface having a flatness of 1/2λ (λ=632.8 nm) and a surface roughness of 0.05 μm.Rms. X-ray lithographic membrane 2 is adhered to this supporting frame 1 and, by a known process, an X-ray absorptive material member pattern is formed on the membrane 2.

For positioning of the mask structure 10, a parallel He-Ne laser beam is projected in a direction parallel to a mask reference plane, upon each of the cut-away surfaces 4a and 4b, and the rotational position and the inclination of the mask can be adjusted so that the reflected lights from the cut-away surfaces 4a and 4b superpose upon the on-coming He-Ne laser beams, respectively.

In this embodiment, He-Ne laser beams are projected upon the cut-away surfaces 4a and 4b along two directions, and the reflected lights from the cut-away surfaces 4a and 4b, respectively, are in a symmetrical relationship with each other. Therefore, any inclination can be corrected more precisely.

Figure 11:
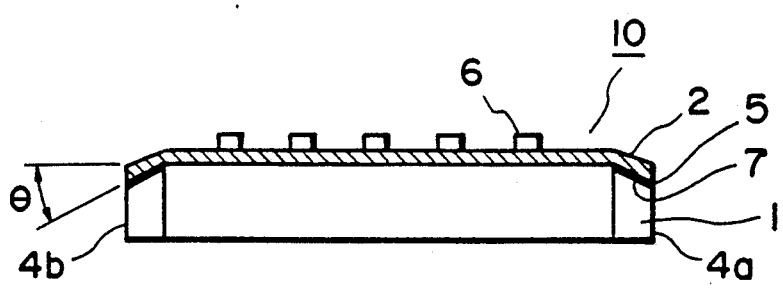
FIG. 11 is a sectional view of a mask structure according to a further embodiment of the present invention.

FIG. 11 is a sectional view of a lithographic mask structure according to a still further embodiment of the present invention.

In this embodiment, a part of a flat surface 7 at the outer peripheral portion of a supporting frame 1, to which a membrane 2 is to be adhered, is formed into a slant, being inclined toward the outer periphery. Further, two cut-away surfaces 4a and 4b are provided at peripheral portions of the supporting frame 1. In this embodiment, the angle $\theta$ of the slant is suitably within a range of 5–30 degrees.

The provision of such a slant is effective to prevent the mask holding surface of the membrane 2 from being affected by an adhesive 5, with a result that a good flatness can be attained over the mask holding surface of the membrane 2.

Figure 12:
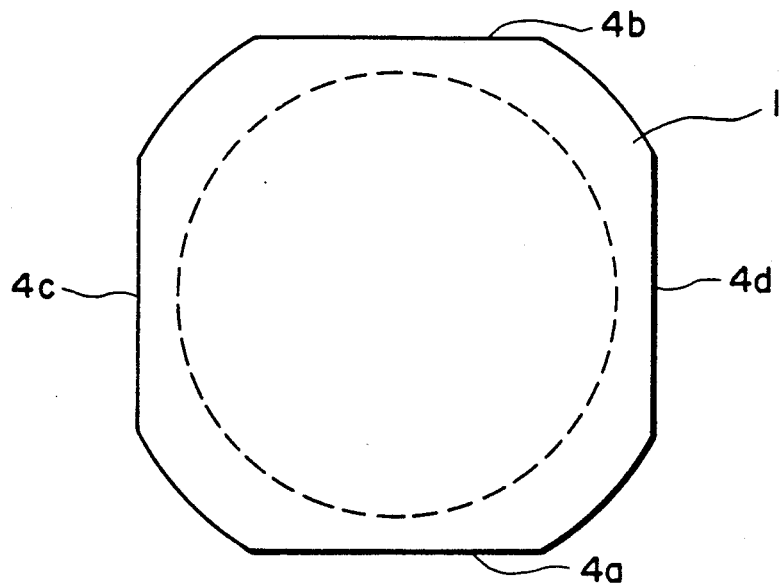
FIG. 12 is a top plan view of a mask structure according to a yet further embodiment of the present invention.

FIG. 12 is a top plan view of a lithographic mask structure according to a yet further embodiment of the present invention. In this embodiment, four cut-away surfaces 4a, 4b, 4c and 4d are provided at an outer peripheral portion of a supporting frame 1, in a manner that they are in a symmetric relationship with respect to two orthogonal directions, respectively, as seen in this figure.

With this arrangement, at the front and rear sides as well as at the left and right sides, the rotational position and the inclination of the mask 10 can be corrected with high precision.

Figure 13:
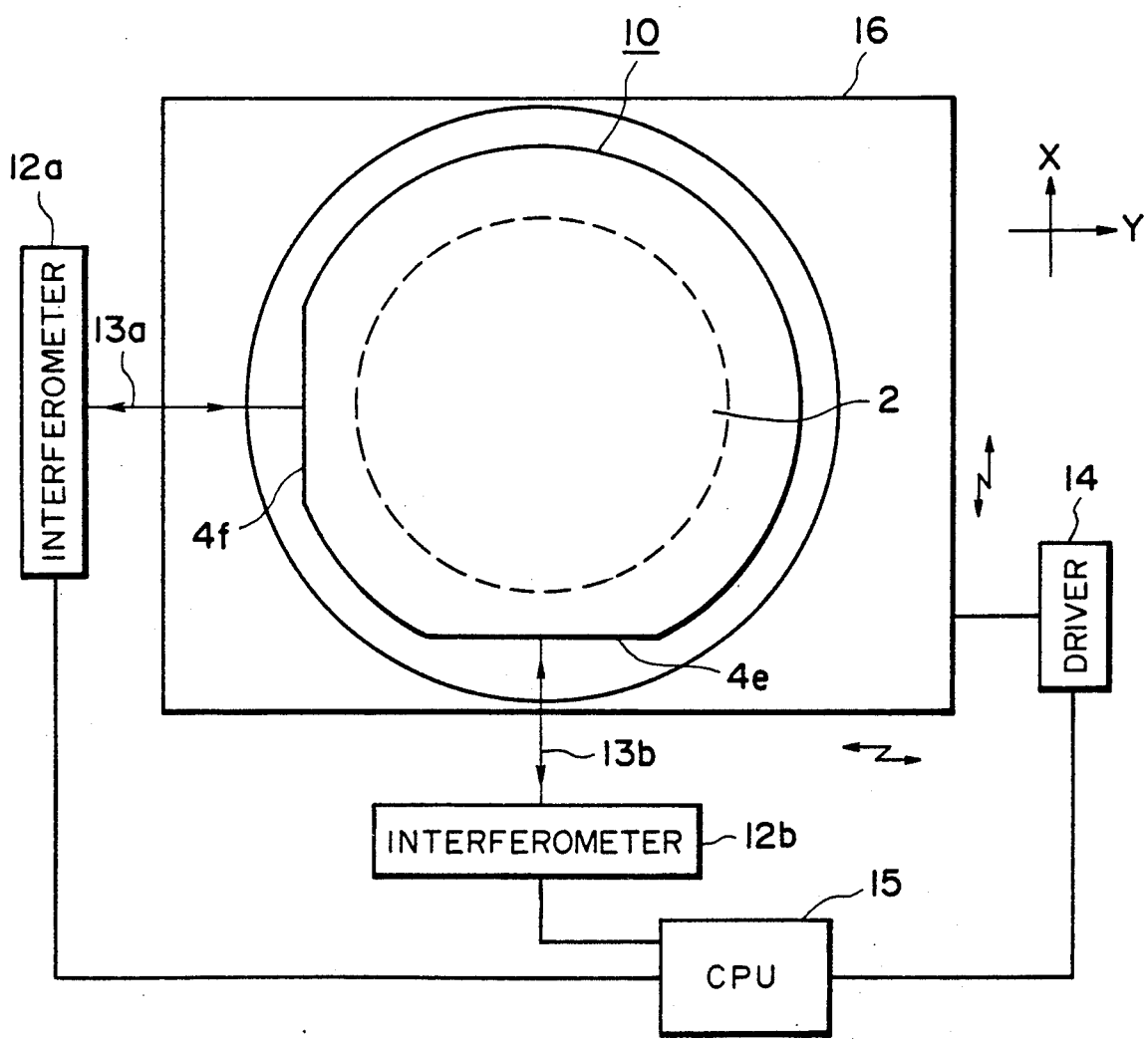
FIG. 13 is a schematic and diagrammatic view, showing a mask structure and a mask positioning device arranged in accordance with a further aspect of the present invention.

While the foregoing description has been provided for a mask structure as well as a method and device suitably usable therewith, all being adapted to detect any error of the mask in a rotational direction and/or a vertical direction, with respect to an associated reference direction, the attitude of the mask being corrected on the basis of the detection, but also the position of the mask in the orthogonal coordinate system (X-Y coordinate system) can be adjusted easily. This will be explained below, taken in conjunction with FIG. 13.

The same numerals as of the foregoing examples are assigned to similar or corresponding elements. Denoted at 4e and 4f are cut-away surfaces formed at those sides of a mask 10 extending in two orthogonal directions. Each cut-away surface has been finished into a mirror surface. Denoted at 12a and 12b each is a laser interferometer fixed to the apparatus side and functions as a reference (apparatus side reference) for the mask 10. Denoted at 14 is a driving means for moving a movable stage 16; denoted at 15 is a central processing unit (CPU) for controlling the driving means 14; denoted at 16 is the stage which is movable in X-axis and Y-axis directions; and denoted at 13a and 13b are laser beams from the respective laser interferometers. The laser interferometers 12a and 12b are provided so that their optical axes along which the laser beams 13a and 13b emanate extend orthogonally to each other.

In operation, by using the laser beams emanating from the laser interferometers 12a and 12b, respectively, the relative position of the mask in the X-axis and Y-axis directions, with respect to the aforesaid references, can be detected. In response to signals produced as a result of the detection, the CPU 15 controls the driving means 14 so as to correct the position of the mask with respect to the X-axis and Y-axis references.

Where the present embodiment is combined with any one of the embodiments described hereinbefore, it is very easily possible to accurately align a mask with respect to an apparatus (e.g., a semiconductor device manufacturing apparatus).

Further, while the foregoing description has been provided for an X-ray lithographic mask wherein a membrane is adhered to a supporting frame having a generally ring-like shape, the invention is not limited to such a mask structure. As an example, the invention is applicable also to a mask structure wherein a pattern is formed on a glass plate of generally circular configuration Substantially the same advantageous effects are attainable in that case.

While the invention has been described with reference to the structures disclosed herein, it is not confined to the details set forth and this application is intended to cover such modifications or changes as may come within the purposes of the improvements or the scope of the following claims.

What is claimed is:

1. A combination of a lithographic mask having a pattern formed on a membrane used for the manufacture of a semiconductor devices and a positioning device having a movable holder for holding and positioning the mask, the combination comprising:

a generally ring-like frame member for supporting the membrane, said frame member having a substantially circumferentially extending peripheral surface portion and a substantially flat surface portion extending in a direction intersecting the membrane and providing a positional reference for the mask;

a light source for projecting a light beam to said substantially flat surface portion of said frame member of the mask as held by the holder;

a detector for detecting at least a portion of a light beam reflected by said flat surface portion of said frame member, said detector producing an output corresponding to the detected light beam; and control means for controlling at least one of a rotational position and a translational position of the holder in response to the output of said detector.

2. A device according to claim 1, wherein said detector includes a flat light receiving surface and wherein said detector produces a signal corresponding to the position of incidence of the light upon said light receiving surface.

* * * * *

UNITED STATES PATENT AND TRADEMARK OFFICE
CERTIFICATE OF CORRECTION

PATENT NO. : 5,042,945

DATED : August 27, 1991

INVENTOR(S) : Hirofumi Shibata, et al

It is certified that error appears in the above-identified patent and that said Letters Patent is hereby corrected as shown below:

Title Page:

In item [56] References Cited

U.S. PATENT DOCUMENTS, "3,449,961  1/1969  Samsel" should read --3,449,961  6/1969  Samsel--; and "4,801,120  1/1989  Katoh et al." should read --4,801,208  1/1989  Katoh et al.--.

In item [57] ABSTRACT

Line 11, "position." should read --positions.--.

COLUMN 1

Line 68, "coating" should read --coated--.

COLUMN 3

Line 54, "ma" should read --may--.

Column 9

Line 12, "devices" should read --device--.

Signed and Sealed this

Thirteenth Day of April, 1993

Attest:

STEPHEN G. KUNIN

Attesting Officer

Acting Commissioner of Patents and Trademarks